United States Patent [19]

Finley

[11] Patent Number: 4,898,789
[45] Date of Patent: * Feb. 6, 1990

[54] LOW EMISSIVITY FILM FOR AUTOMOTIVE HEAT LOAD REDUCTION

[75] Inventor: James J. Finley, Pittsburgh, Pa.

[73] Assignee: PPG Industries, Inc., Pittsburgh, Pa.

[*] Notice: The portion of the term of this patent subsequent to Feb. 6, 2007 has been disclaimed.

[21] Appl. No.: 176,979

[22] Filed: Apr. 4, 1988

[51] Int. Cl.$^4$ .............................................. B21D 39/00
[52] U.S. Cl. ..................................... 428/623; 428/432; 428/469; 428/632; 428/633; 428/660; 428/673
[58] Field of Search ............... 428/432, 469, 623, 630, 428/632, 633, 660, 673

[56] References Cited

U.S. PATENT DOCUMENTS

| 4,094,763 | 6/1978 | Gillery et al. | 204/192 P |
|---|---|---|---|
| 4,113,599 | 9/1978 | Gillery | 204/192 P |
| 4,166,018 | 8/1979 | Chapin | 204/192 R |
| 4,201,649 | 5/1980 | Gillery | 204/192 P |
| 4,327,967 | 5/1982 | Groth | 350/258 |
| 4,349,425 | 9/1982 | Miyake et al. | 204/192 P |
| 4,413,877 | 11/1983 | Suzuki et al. | 350/1.7 |
| 4,462,883 | 7/1984 | Hart | 204/192 C |
| 4,497,700 | 2/1985 | Groth et al. | 204/192 P |
| 4,548,691 | 10/1985 | Dietrich et al. | 204/192 P |
| 4,610,771 | 9/1986 | Gillery | 204/192.1 |
| 4,716,086 | 12/1987 | Gillery et al. | 428/630 |

Primary Examiner—Nam X. Nguyen
Attorney, Agent, or Firm—Donna L. Seidel

[57] ABSTRACT

A multiple-layer, high transmittance, low emissivity coated article is disclosed comprising at least two infrared reflective metal layers alternatingly combined with at least three metal oxide antireflective layers to produce a coating with superior low emissivity and low visible reflectance, especially for use to reduce heat load in automobiles.

11 Claims, No Drawings

LOW EMISSIVITY FILM FOR AUTOMOTIVE HEAT LOAD REDUCTION

This application is related in subject matter to U.S. Ser. No. 176,511 filed Apr. 1, 1989, by the same inventor.

BACKGROUND OF THE INVENTION

The present invention relates generally to the art of cathode sputtering of metal oxide films, and more particularly to the art of magnetic sputtering of multiple layer films of metal and metal oxide.

U.S. Pat. No. 4,094,763 to Gillery et al discloses producing transparent, electroconductive articles by cathode sputtering metals such as tin and indium onto refractory substrates such as glass at a temperature above 400° F. in a low pressure atmosphere containing a controlled amount of oxygen.

U.S. Pat. No. 4,113,599 to Gillery teaches a cathode sputtering technique for the reactive deposition of indium oxide in which the flow rate of oxygen is adjusted to maintain a constant discharge current while the flow rate of argon is adjusted to maintain a constant pressure in the sputtering chamber.

U.S. Pat. No. 4,166,018 to Chapin describes a sputtering apparatus in which a magnetic field is formed adjacent a planar sputtering surface, the field comprising arching lines of flux over a closed loop erosion region on the sputtering surface.

U.S. Pat. No. 4,201,649 to Gillery discloses a method for making low resistance indium oxide thin films by first depositing a very thin primer layer of indium oxide at low temperature before heating the substrate to deposit the major thickness of the conductive layer of indium oxide by cathode sputtering at typically high cathode sputtering temperatures.

U.S. Pat. No. 4,327,967 to Groth discloses a heat-reflecting panel having a neutral-color outer appearance comprising a glass pane, an interference film having a refractive index greater than 2 on the glass surface, a heat reflecting gold film over the interference film and a neutralization film of chromium, iron, nickel, titanium or alloys thereof over the gold film.

U.S. Pat. No. 4,349,425 to Miyake et al discloses d-c reactive sputtering of cadmium-tin alloys in argon-oxygen mixtures to form cadmium-tin oxide films having low electrical resistivity and high optical transparency.

U.S. Pat. No. 4,462,883 to Hart discloses a low emissivity coating produced by cathode sputtering a layer of silver, a small amount of metal other than silver, and an antireflection layer of metal oxide onto a transparent substrate such as glass. The antireflection layer may be tin oxide, titanium oxide, zinc oxide, indium oxide, bismuth oxide or zirconium oxide.

In the interest of improving the energy efficiency of double-glazed window units, it is desirable to provide a coating on one of the glass surfaces which increases the insulating capability of the unit by reducing radiative heat transfer. The coating therefore must have a low emissivity in the infrared wavelength range of the radiation spectrum. For practical reasons, the coating must have a high transmittance in the visible wavelength range. For aesthetic reasons, the coating should have a low luminous reflectance and preferably be essentially colorless.

High transmittance, low emissivity coatings as described above generally comprise a thin metallic layer, for infrared reflectance and low emissivity, sandwiched between dielectric layers of metal oxides to reduce the visible reflectance. These multiple layer films are typically produced by cathode sputtering, especially magnetron sputtering. The metallic layer may be gold or copper, but is generally silver. The metal oxide layers described in the prior art include tin oxide, indium oxide, titanium oxide, bismuth oxide, zinc oxide, zirconium oxide and lead oxide. In some cases, these oxides incorporate small amounts of other metals, such as manganese in bismuth oxide, indium in tin oxide and vice verse, to overcome certain disadvantages such as poor durability or marginal emissivity. However, all of these metal oxides have some deficiency.

Although the coating may be maintained on an interior surface of a double-glazed window unit in use, where it is protected from the elements and environmental agents which would cause its deterioration, a durable effective coating able to withstand handling, packaging, washing and other fabrication processes encountered between manufacture and installation is particularly desirable. These properties are sought in the metal oxide. However, in addition to hardness which provides mechanical durability, inertness which provides chemical durability, and good adhesion to both the glass and the metal layer, the metal oxide should have the following properties as well.

The metal oxide must have a reasonably high refractive index, preferably greater than 2.0, to reduce the reflection of the metallic layer and thus enhance the transmittance of the coated product. The metal oxide must also have minimal absorption to maximize the transmittance of the coated product. For commercial reasons, the metal oxide should be reasonably priced, have a relatively fast deposition rate by magnetron sputtering, and be nontoxic.

Perhaps the most important, and most difficult to satisfy, requirements of the metal oxide film relate to its interaction with the metallic film. The metal oxide film must have low porosity, to protect the underlying metallic film from external agents, and low diffusivity for the metal to maintain the integrity of the separate layers. Finally, and above all, the metal oxide must provide a good nucleation surface for the deposition of the metallic layer, so that a continuous metallic film can be deposited with minimum resistance and maximum transmittance. The characteristics of continuous and discontinuous silver films are described in U.S. Pat. No. 4,462,884 to Gillery et al the disclosure of which is incorporated herein by reference.

Of the metal oxide multiple-layer films in general use, those comprising zinc oxide and bismuth oxide are insufficiently durable, those oxides being soluble in both acid and alkaline agents, with the multiple-layer film being degraded by fingerprints, and destroyed in salt, sulfur dioxide and humidity tests. Indium oxide, preferably doped with tin, is more durable and protective of an underlying metal layer; however, indium sputters slowly and is relatively expensive. Tin oxide, which may be doped with indium or antimony, is also more durable and protective of an underlying metal layer, but does not provide a suitable surface for nucleation of the silver film, resulting in high resistance and low transmittance. The characteristics of a metal oxide film which result in proper nucleation of a subsequently deposited silver film have not been established; however, trial-and-error experimentation has been widely practiced with the metal oxides described above.

U.S. Pat. No. 4,610,771 to Gillery, the disclosure of which is incorporated herein by reference, provides a novel film composition of an oxide of a zinc-tin alloy, as well as a novel multiple-layer film of silver and zinc-tin alloy oxide layers for use as a high transmittance, low emissivity coating.

U.S. Pat. No. 4,716,086 to Gillery discloses improving the durability of multiply layer films, especially multiple layer films comprising antireflective metal and/or metal alloy oxide layers and infrared reflective metal layers such as silver, by providing an exterior protective layer of a particularly chemical resistant material such as titanium oxide.

U.S. application Ser. No. 841,056 filed Mar. 17, 1986, by Gillery et al discloses improving the durability of multiple layer films, especially multiply layer films comprising antireflective metal and/or metal alloy oxide layers and infrared reflective metal layers such as silver, by providing a primer layer such as copper which improves adhesion between the metal and metal oxide layers.

While multiple-layer, low-emissivity, high transmittance films have been made sufficiently durable for architectural applications in multiple glazed window units, such films have not been sufficiently temperature-resistant to withstand high temperature processing, such as tempering or bending.

SUMMARY OF THE INVENTION

The present invention involves a novel multiple-layer coating which provides superior heat load reduction to a transparency, especially for use as an automotive windshield, side or back lite, without distracting visible reflectance. The novel multiple-layer coating of the present invention comprises a first antireflective metal oxide layer such as an oxide of zinc and tin, an infrared reflective metal layer such as silver, a primer layer containing titanium, a second thicker metal oxide layer, another infrared reflective metal layer such as silver, an additional primer layer, a third antireflective metal oxide layer, and, preferably, an exterior protective layer of titanium metal or titanium oxide.

DETAILED DESCRIPTION OF THE PREFERRED EMBODIMENTS

A film composition preferably comprising an oxide of a metal or metal alloy is preferably deposited by cathode sputtering, preferably magnetron sputtering. A cathode target is prepared comprising the desired metal or metal alloy elements. The target is then sputtered in a reactive atmosphere, preferably containing oxygen in order to deposit a metal or metal alloy oxide film on a surface of a substrate.

A preferred metal alloy oxide in accordance with the present invention is an oxide of an alloy comprising zinc and tin. A zinc/tin alloy oxide film may be deposited in accordance with the present invention by cathode sputtering, preferably magnetically enhanced. Cathode sputtering is also a preferred method for depositing high transmittance, low emissivity films in accordance with the present invention. Such films typically comprise multiple layers, preferably a layer of a highly reflective metal such as gold or silver sandwiched between antireflective metal oxide layers such as indium oxide or titanium oxide, or preferably an oxide of an alloy of zinc and tin which preferably comprises zinc stannate.

While various metal alloys may be sputtered to form metal alloy oxide films, in order to produce a preferred high transmittance, low emissivity multiple layer film in accordance with the present invention, alloys of tin and zinc are preferred. A particularly preferred alloy comprises zinc and tin, preferably in proportions of 10 to 90 percent zinc and 90 to 10 percent tin. A preferred zinc/tin alloy ranges from 30 to 60 percent zinc, preferably having a zinc/tin ratio from 40:60 to 60:40. A most preferred range is 46:54 to 50:50 by weight tin to zinc. A cathode of zinc/tin alloy reactively sputtered in an oxidizing atmosphere results in the deposition of a metal oxide layer comprising zinc, tin and oxygen, preferably comprising zinc stannate, $Zn_2SnO_4$.

In a conventional magnetron sputtering process, a substrate is placed within a coating chamber in facing relation with a cathode having a target surface of the material to be sputtered. Preferred substrates in accordance with the present invention include glass, ceramics and plastics which are not detrimentally affected by the operating conditions of the coating process.

The cathode may be of any conventional design, preferably an elongated rectangular design, connected with a source of electrical potential, and preferably employed in combination with a magnetic field to enhance the sputtering process. At least one cathode target surface comprises a metal alloy such as zinc/tin which is sputtered in a reactive atmosphere to form a metal alloy oxide film. The anode is preferably a symmetrically designed and positioned assembly as taught in U.S. Pat. No. 4,478,702 to Gillery et al, the disclosure of which is incorporated herein by reference.

In a preferred embodiment of the present invention, a multiple layer film is deposited by cathode sputtering to form a high transmittance, low emissivity coating. In addition to the metal alloy target, at least one other cathode target surface comprises a metal to be sputtered to form a reflective metallic layer. At least one additional cathode target surface comprises the titanium to be sputtered to deposit a titanium oxide layer. A durable multiple layer coating having two reflective metallic films in alternating combination with three antireflective metal alloy oxide films is produced as follows, using a titanium oxide primer layer to improve the adhesion between the metal and metal oxide films, which primer layer also provides high-temperature resistance to the multiple-layer coating in accordance with the present invention so that the resultant coated article may be subjected to high temperature processing, such as bending, annealing tempering, laminating, or glass welding without deterioration of the coating.

The thickness of the primer layer of the present invention is preferably at least 10 Angstroms, limited only by the desired transmittance of the film, more preferably about 12 to 30 Angstroms. If a single primer layer is deposited over the reflective metal film, the thickness is preferably greater than 20 Angstroms. If the thickness of the primer layer over the reflective metal layer is less than 20 Angstroms, preferably an additional primer layer is deposited between the first antireflective metal oxide layer and the infrared reflective metal layer.

A clean glass substrate is placed in a coating chamber which is evacuated, preferably to less than $10^{-4}$ torr, more preferably less than $2\times 10^{-5}$ torr. A selected atmosphere of inert and reactive gases, preferably argon and oxygen, is established in the chamber to a pressure between about $5\times 10^{-4}$ and $10^{-2}$ torr. A cathode having a target surface of zinc/tin metal is operated over the surface of the substrate to be coated. The target metal is sputtered, reacting with the atmosphere in the chamber to deposit a zinc/tin alloy oxide coating layer on the glass surface.

After the initial layer of zinc/tin alloy oxide is deposited, the coating chamber is evacuated, and an inert atmosphere such as pure argon is established at a pressure between about $5 \times 10^{-4}$ and $10^{-2}$ torr. Preferably, a cathode having a target surface of titanium is sputtered to deposit a first titanium metal primer layer over the zinc/tin alloy oxide layer. In an alternative embodiment, the titanium cathode may be sputtered in a slightly oxidizing atmosphere to deposit a titanium oxide primer layer over the zinc/tin alloy oxide layer. A cathode having a target surface of silver is then sputtered to deposit a reflective layer of metallic silver over the primer layer. A second primer layer is preferably deposited by sputtering titanium over the reflective silver layer. Again, the titanium may be sputtered in an inert atmosphere to deposit a metallic titanium primer layer, or in a slightly oxidizing atmosphere to deposit a titanium oxide primer layer. Next, a second layer of zinc/tin alloy oxide is deposited over the second primer layer under essentially the same conditions used to deposit the first zinc/tin alloy oxide layer, except that the thickness of this layer is approximately double the thickness of the first. Preferably, another primer layer is deposited, followed by a second infrared reflective metal layer, preferably yet another primer layer, then a third antireflective metal oxide layer of about the same thickness as the first, and finally, preferably, a protective film such as titanium oxide, the thickness of which is limited only by the desired final transmittance of the coating.

In most preferred embodiments of the present invention, a protective overcoat is deposited over the final antireflective metal oxide film. The protective overcoat is preferably deposited by sputtering over the antireflective metal oxide film a layer of a metal such as disclosed in U.S. Pat. No. 4,594,137 to Gillery et al. Preferred metals for the protective overcoat include alloys of iron or nickel, such as stainless steel or Inconel. Titanium is a most preferred overcoat because of its high transmittance. In an alternative embodiment, the protective layer may be a particularly chemical resistant material such as titanium oxide as disclosed in U.S. Pat. No. 4,716,086 to Gillery et al, the disclosure of which is incorporate herein by reference.

The chemical resistance of a multiple layer film is most improved by depositing a protective coating comprising titanium oxide over the multiple layer film. Preferably, the titanium oxide protective coating is deposited by cathode sputtering at a relatively high deposition rate and low pressure, preferably about 3 millitorr. A protective coating comprising titanium oxide may be formed by sputtering titanium in an oxygen-sufficient atmosphere to deposit titanium oxide directly. In an alternative embodiment of the present invention, a protective coating comprising titanium oxide may be formed by sputtering titanium in an inert atmosphere to deposit a titanium-containing film which subsequently oxidizes to titanium oxide upon exposure to an oxidizing atmosphere such as air.

Similarly, if the primer layers of the present invention are deposited in an inert atmosphere as titanium metal, subsequent high temperature processing results in oxidation of the metal to form titanium oxide.

The present invention will be further understood from the description of a specific example which follows. In the example, the zinc/tin alloy oxide film is referred to as zinc stannate although the film composition need not be precisely $Zn_2SnO_4$.

EXAMPLE

A multiple layer film is deposited on a soda-lime silica glass substrate to produce a high transmittance, low emissivity coated product. A stationary cathode measuring 5 by 17 inches (12.7 by 43.2 centimeters) comprises a sputtering surface of zinc/tin alloy consisting of 52.4 weight percent zinc and 47.6 percent tin. A soda-lime-silica glass substrate is placed in the coating chamber which is evaluated to establish a pressure of 4 millitorr in an atmosphere of 50/50 argon/oxygen. The cathode is sputtered in a magnetic field at a power of 1.7 kilowatts while the glass is conveyed past the sputtering surface at a rate of 120 inches (3.0 meters) per minute. A film of zinc stannate is deposited on the glass surface. Three passes produce a film thickness of about 300 Angstroms, resulting in a decrease in transmittance from 90 percent for the glass substrate to 84 percent for the zinc stannate coated glass substrate. Next, a layer of silver is deposited over the titanium primer layer by sputtering a silver cathode target in an atmosphere of argon gas at a pressure of 4 millitorr. With the substrate passing under the silver cathode target at the same rate, two passes are necessary to deposit 100 Angstroms of silver, further reducing the transmittance to 66 percent. A titanium primer layer 15 Angstroms thick is sputtered over the silver layer, decreasing the transmittance to 56.5 percent. Then the second antireflective layer of zinc stannate is deposited, 600 Angstroms thick, increasing the transmittance to 73 percent, followed by a second 100 Angstrom thick silver layer, which decreases the transmittance to 69.5 percent. A final titanium primer layer 15 Angstroms thick decreases the transmittance to 58 percent, after which a final 300 Angstrom thick zinc stannate antireflective layer is deposited which increases the transmittance finally to 78 percent.

Optionally, a stationary titanium cathode measuring 5 by 17 inches (12.7 by 43.2 centimeters) is sputtered at 10 kilowatts in an atmosphere comprising equal volumes of argon and oxygen at a pressure of 3 millitorr to deposit a protective coating of titanium oxide about 15 to 20 Angstroms thick. The protective coating of titanium oxide does not significantly affect the resistance and reflectance properties of the multiple-layer coating, and changes the transmittance no more than about one percent.

The improved durability of the coated article resulting from the improved adhesion between the metal and metal oxide films as a result of the primer layers of the present invention is readily demonstrated by a simple abrasion test consisting of wiping the coated surface with a damp cloth. A surface coated with zinc stannate/silver/zinc stannate having no primer layers increases in reflectance from about 6 percent to about 18 percent after several passes of a damp cloth, indicating removal of both the top zinc stannate and the underlying silver films. In contrast, prolonged vigorous rubbing with a damp cloth produces no visible change in a zinc stannate/titanium/silver/titanium/zinc stannate/titanium/silver/titanium/zinc stannate/titanium oxide coated article of the present invention.

Preferred titanium oxide protective coatings have thicknesses in the range of about 10 to 50 Angstroms. Thicker films may be used, limited only by the desired transmittance. With a titanium oxide protective coating about 20 Angstroms thick, the durability of a multiple layer coating in accordance with this example is increased from 2 hours to 22 hours in a 2½ percent salt solution at ambient temperature, and from 5 hours to one week in the Cleveland humidity test conducted with a Q-Panel Cleveland Condensation Tester Model QCT-AD0 containing deionized water at 150° F. (about 66° C.).

A typical coated article of the present invention comprising two 9 Angstrom thick silver infrared reflective layers transmits 40 percent and reflects 30 percent of total solar energy compared with total solar energy transmittance of 45 percent and total solar energy reflectance of 27 percent for a standard low emissivity coating containing a single layer of silver and having the same luminous transmittance of about 73 percent. In addition, the visible reflectance of the coating of this example is 8 percent and neutral compared to 14 percent and bronze for a standard low emissivity coating having about 130 Angstroms of silver in a single layer. The above optical properties are measured after lamination of a coated clear glass sheet to a tinted glass sheet.

The above example is offered to illustrate the present invention. Various modifications of the product and the process are included. For example, other coating compositions are within the scope of the present invention. Depending on the proportions of zinc and tin when a zinc/tin alloy is sputtered, the coating may contain widely varying amounts of zinc oxide and tin oxide in addition to zinc stannate. The primer layers may comprise titanium metal in various states of oxidation. Other metals such as zirconium, chromium and zin/tin alloy are also useful as primers in accordance with the present invention. The thicknesses of the various layers are limited primarily by the desired optical properties such as transmittance. More than two infrared reflective layers alternating with more than three antireflective layers may also be used, again depending on the desired optical properties. Process parameters such as pressure and concentration of gases may be varied over a broad range. Protective coatings of other chemically resistant materials may be deposited as either metal or oxides. The coatings of the present invention may be applied to flat glass which is subsequently subjected to high temperature processing such as tempering and bending as well as lamination. The scope of the present invention is defined by the following claims.

What is claimed:

1. A high transmittance, low emissivity article comprising:
   a. a transparent nonmetallic substrate;
   b. a first transparent antireflective metal oxide film deposited on a surface of said substrate;
   c. a first transparent infrared reflective metallic film deposited on said antireflective metal oxide film;
   d. a transparent metal-containing primer film deposited on said infrared reflective metallic film;
   e. a second transparent antireflective metal oxide film deposited on said primer film;
   f. a second transparent infrared reflective metallic film deposited on said second transparent antireflective metal oxide film;
   g. a second transparent metal-containing primer film deposited on said second infrared reflective metallic film; and
   h. a third transparent antireflective metal oxide film deposited on said second primer film.

2. An article according to claim 1, wherein the substrate is glass.

3. An article according to claim 2, wherein the reflective metallic films are silver.

4. An article according to claim 3, wherein the antireflective metal oxide films comprise an oxide reaction product of zinc and tin.

5. An article according to claim 1, wherein said primer films comprise titanium.

6. An article according to claim 1, further comprising an additional primer layer between said first transparent antireflective metal oxide film and said first transparent infrared reflective metallic film.

7. An article according to claim 6, wherein said additional primer layer comprises titanium.

8. An article according to claim 7, further comprising a second additional primer layer between said second transparent antireflective metal oxide film and said second transparent infrared reflective metal film.

9. An article according to claim 8, wherein all primer layers comprise titanium.

10. An article according to claim 1, further comprising a protective metal-containing overcoat deposited over said third transparent antireflective metal oxide film.

11. An article according to claim 1, wherein said substrate is an automotive windshield, side lite or back lite.

* * * * *